Feb. 2, 1960 E. J. SLOBODZINSKI ET AL 2,923,838

LOW VOLTAGE LEVEL TRANSISTOR GATES

Filed Dec. 20, 1957

INVENTORS
EDWIN J. SLOBODZINSKI
HANNON S. YOURKE

BY Alvin J. Riddles
ATTORNEY

United States Patent Office 2,923,838

Patented Feb. 2, 1960

2,923,838

LOW VOLTAGE LEVEL TRANSISTOR GATES

Edwin J. Slobodzinski, Hopewell Junction, and Hannon S. Yourke, Poughkeepsie, N.Y., assignors to International Business Machines Corporation, New York, N.Y., a corporation of New York Application December 20, 1957, Serial No. 704,160

14 Claims. (Cl. 307—88.5)

This invention relates to binary gates for Eccles-Jordan type bistable circuits and in particular to low voltage level transistor binary type gates.

It has been found in the use of Eccles-Jordan type bistable circuitry that in order to adapt such a circuit to binary operation, that is, to operation wherein a change of stable state occurs as a result of repeated input signals of the same polarity at the same terminal, it is necessary to provide a gate which, in response to the stable state in which the circuit is resting, will direct the input signal to the proper input of the Eccles-Jordan type circuit to cause a change of stable state. Frequently, when an Eccles-Jordan type circuit is designed for very high frequency type operation, a minimum amount of loading can be tolerated on the inputs and outputs of the circuit without having a detrimental effect on the frequency response. The gate of this invention is designed to provide the absolute minimum of loading on a sensitive Eccles-Jordan type bistable circuit. This is accomplished by providing three active elements, each serving as a current switching type network, one of the active elements senses one of the outputs of the Eccles-Jordan type circuit and the output of two of the active elements serve as signal direction elements to the inputs of the bistable circuit.

A primary object of this invention is to provide an improved binary type circuit gate.

Another object of this invention is to provide a two stage, current switching, binary type circuit gate.

Still another object of this invention is to provide a three active element binary type circuit gate.

Still another object of this invention is to provide a binary type circuit gate applying a very small load to the bistable circuit.

A related object of this invention is to provide an improved binary type bistable circuit.

Other objects of the invention will be pointed out in the following description and claims and illustrated in the accompanying drawings, which disclose, by way of example, the principle of the invention and the best mode, which has been contemplated, of applying that principle.

Figure 1:
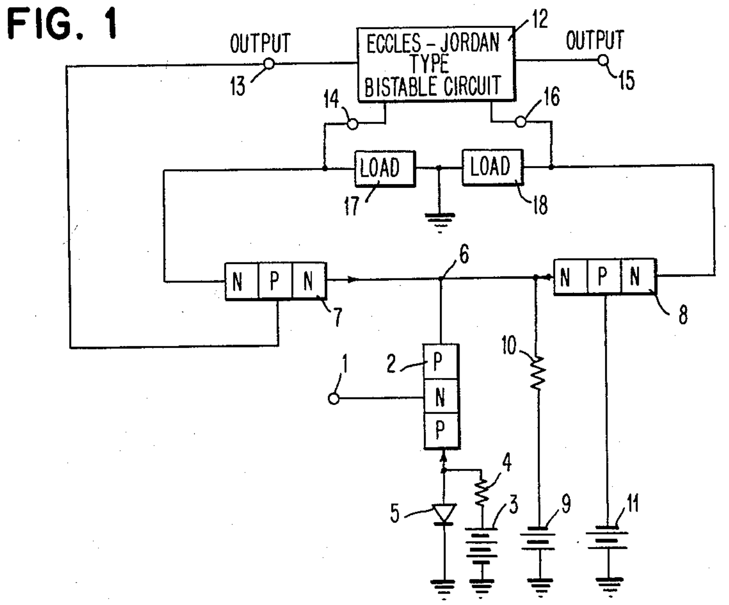
Fig. 1 is an illustration of a binary type gate of this invention connected to the inputs and outputs of a block diagram representing a typical Eccles-Jordan type bistable circuit.

Referring to Fig. 1, a three element gate is shown in which an input is introduced at a terminal 1 to the base of a first active element 2 which switches the current provided to the emitter of the element 2 from battery 3 and resistor 4 which serve as a constant current source, a diode 5 provides an alternate path between the emitter of element 2 and ground. The collector of element 2 is connected to a common point 6 to which the emitters of active elements 7 and 8, to be later described, are connected. A constant current source, shown as a battery 9 and resistor 10, in series, is also connected to the emitters of transistors 7 and 8. Transistor 8 is operated in the grounded base type of operation and has its base connected to a compatible source of potential with the remainder of the circuitry, shown in this illustration, as battery 11. Transistor 7 has its base connected to one of the outputs of a typical Eccles-Jordan type bistable circuit, shown in block form, as element 12 and having its outputs and inputs labelled elements 13, 14, 15 and 16. The collector of transistor 7 is connected directly to input 14 and the collector of transistor 8 is connected to input 16.

Load impedances compatible with the input of the bistable circuit are provided for transistors 7 and 8 and are shown as loads 17 and 18. All Eccles-Jordan type bistable circuits have in common, two active stages cross-coupled such that one active stage being in the "On" condition has the effect of its "On" condition coupled in such a manner that the other active stage is retained in the "Off" condition, thus, each such circuit has two outputs, each output being connected to one of the active stages and two inputs, each input being effective to either interrupt or initiate activity in the particular active stage to which it is connected. The binary type gate of this invention is connected to both inputs and has one connection to sense one of the two outputs of a typical Eccles-Jordan type bistable circuit.

For purposes of illustration in Fig. 1, the sensing output is shown connected to the output 13 of the block diagram representing the Eccles-Jordan type bistable circuit. Considering the current path from battery 9 and resistor 10 as a constant current source to the common point 6, current from this point may then flow through either transistor 7, transistor 2 or transistor 8 depending upon which is the more heavily biased in the direction of current flow. Since transistor 2 has its emitter return through a second constant current source illustrated as battery 3 and resistor 4, then for conditions of no signal of which the input of transistor 2 would remain at a small negative potential, transistor 2 would be conducting and would provide a path for the current supplied to the point 6. When, for the transistor conductivity and polarity, shown in this illustration, a positive pulse representing an input signal were to appear at input terminal 1, the base of transistor 2 would change potential level, such that transistor 2 would be cut off and the constant current source comprising battery 3 and resistor 4 would then supply current through diode 5 to ground. At the same time, at the common point 6, the constant current supplied to this point is now available as emitter current to one of the two transistors 7 or 8 depending upon which is the more heavily biased in the current flow direction. The bias for transistor 8 is provided by battery 11 which is of lesser magnitude and of the same polarity as battery 9. Consequently, depending upon the stable state of the circuit, either transistor 7 will sense a greater or lesser magnitude of bias than that provided by battery 11 and current will flow through either transistor 7 or transistor 8. The collector current path for each of these transistors is returned to reference through a load shown as 17 and 18 which is compatible with the input of the bistable circuit and each collector is directly connected to one of the inputs.

Assuming for sake of illustration that the Eccles-Jordan type bistable circuit 12 is in a stable state condition wherein the output 13 and input 14 associated with the particular active element of the trigger are connected to the element that is conducting at the time. Under these conditions, output 13 would be at a higher potential level than output 15. Hence, output 13 would provide a greater positive bias on the base of transistor 7 than that selected to be provided by battery 11 on transistor 8. Thus, when a signal applied at terminal 1 causing current flow through transistor 2, emitter current is removed and transistor 7 which had been conducting, turns Off and in effect applies a positive pulse to input 14 and turns Off the active element associated with input 14 and output 13. When this occurs, the cross-coupling within the trigger itself turns On the other active element and holds the Eccles-Jordan type circuit in the new stable state. At the end of the input pulse time, transistor 2 again turns Off and current flow from point 6 flows thereto through transistor 8 since output 13 is Off and the potential at this point is more negative than battery 11. A subsequent negative input pulse at terminal 1 again removes emitter curent for either transistor 7 or transistor 8. However, in the new stable state, transistor 7 is not the more heavily biased due to the fact that the active element of the Eccles-Jordan type bistable circuit 12, the condition of which is sensed by transistor 7, namely, the output 13 side is no longer conducting and is negative; hence, with the subsequent negative input pulse, transistor 8 turns Off and a positive pulse is applied to input 14 cutting off the active element associated with that input. This permits the Eccles-Jordan type circuit 12 to return to its original stable state. The above described bistable gate is a very powerful and versatile switching tool in the design of Eccles-Jordan type bistable circuitry in that it provides its own loads and therefore does not impede the switching speed behavior of an Eccles-Jordan type circuit to which it is applied, since the loads provided by the gate itself may be completely compatible with the inputs of the particularly circuitry. In addition to this, the active elements of the gate, each operate in what is known as the "grounded base" type of operation wherein the time constants of such circuitry are considered faster than those of either the grounded emitter and grounded collector type of transistor circuit operation, well known in the art.

Figure 2:
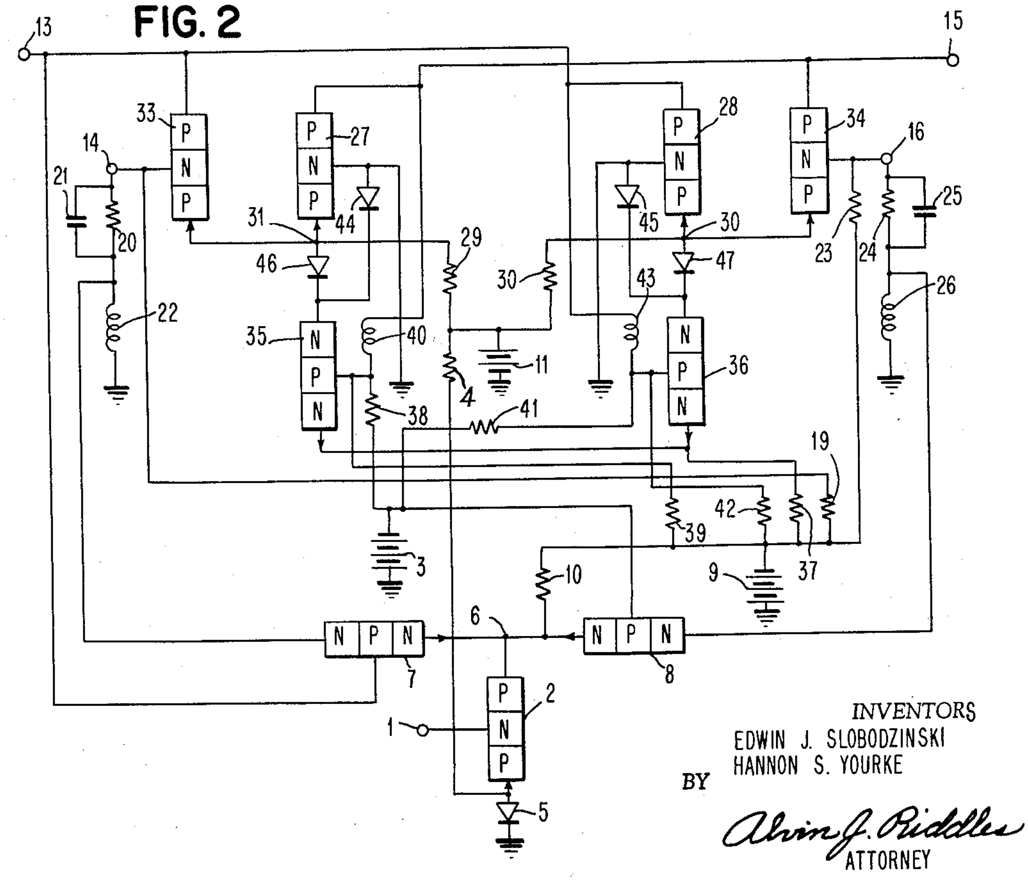
Fig. 2 is an illustration of a highly sensitive Eccles-Jordan type binary gated bistable circuit employing this invention.

As a further illustration of the invention, a current switching type bistable trigger of the Eccles-Jordan cross-coupled type is illustrated in detail in Fig. 2. The elements comprising the gate of Fig. 1 are shown having the same reference numerals in Fig. 2 where compatible, so that the binary input is introduced at terminal 1 switching a constant curent supplied from battery 9 through resistor 10 to the common point 6, from the path through transistor 2 and resistor 4 to battery 11 to the emitters of either transistor 7 or transistor 8. The constant current from battery 11 and resistor 4 to the emitter of transistor 2 when transistor 2 is cut off flows as previously described, through diode 5 to ground and transistor 8 has its base connected to fixed bias shown as battery 3 selected to be less than the Off level at one output of the circuit and greater than the On level at that output. The collector of transistor 7 is shown connected to a load shown as 17 in Fig. 1, comprising resistor 19, resistor 20 and capacitor 21 in parallel, and inductor 22 in series between battery 9 and ground. The collector of transistor 7 is connected to the point between inductor 22 and resistor 20. Similarly, the load 18 of Fig. 1, for transistor 8 comprises resistor 23, resistor 24 and capacitor 25 in parallel, and inductor 26 in series between battery 9 and ground. The collector of transistor 8 is connected between inductor 26 and resistor 24. The function of inductors 22 and 26 are for signal change peaking purposes, well known in the art, in order to improve response of signal change for the bistable circuit. The purpose of capacitors 21 and 25 are to improve turn off response for the bistable circuit. The overall choice of values in the design of the respective loads being such, as to provide compatible load for the input of the bistable circuit and to improve transient response both "On" going and "Off" going.

The bistable circuit itself comprises two stages, selected for illustration as PNP type, transistors 27 and 28. Each of these transistors has its emitter current supplied through a constant curent generator illustrated as battery 11 and resistors 29 and 30, each supplying constant current respectively to common points 31 and 30. Input elements shown as transistors 33 and 34 are provided, each having their emitter current derived from each respective common point. The respective bases of transistors 33 and 34 are connected into the series path of the loads 17 and 18, wherein the base of transistor 33 is connected between resistor 19 and resistor 20 and the base of transistor 34 is connected between resistors 23 and 24. Inverter type latching elements for each active element are shown as transistor 35 for element 27 and transistor 36 for element 28. Both transistor 35 and transistor 36 are connected through resistor 37 to battery 9 as a source of emitter current. The potential level at the base of transistors 35 and 36 is established through a voltage divider network comprising in the case of transistor 35 of a current path from battery 3 through resistor 38, resistor 39 to battery 9 with the base of transistor 35 being connected between the two resistors and the base of transistor 35 is coupled to the collector of transistor 34 through a peaking coil 40 for transient response improvement purposes. The base of transistor 35 is also coupled to the collector of transistor 27 through the peaking coil 40. Similarly, in the case of transistor 36, the voltage divider providing base potential for this transistor comprises a resistor 41 and resistor 42 in a series path from battery 3 to battery 9 with the base of transistor 36 being connected at the mid-point between the two resistors. The base of transistor 36 is connected through a peaking coil 43 to the collector of transistor 33 and to the collector of transistor 28. Since the transistors employed in circuits designed for very high frequency response purposes have very low emitter to base breakdown voltages, diodes 44 and 45 have been provided to prevent the collectors of transistors 35 and 36 from reaching a sufficiently high potential to break down the emitter to base diodes of transistors 27 and 28. Under these conditions, the collectors of transistors 35 and 36 cannot depart from ground potential level by a value greater than the forward impedance across these diodes which is generally of the order of a few tenths of a volt and hence protection is assured. Diodes 46 and 47 serve the function to prevent current flow from ground into the emitters of transistors 27 and 28, 33 and 34, when in the "On" current condition, the emitters of these transistors go below ground potential.

*Operation*

Considering each stage of the bistable circuit as represented by transistors 27 and 28. In each stage, a constant current is supplied to a common point, which point for transistor 27 is 31 and transistor 28 is 32. Sufficient current is supplied to this point to provide emitter current for one of two paths, namely, in the case of point 31 through transistor 27 or transistor 33, and in the case of point 32 through transistor 28 or transistor 34. Under these conditions, current is available for only one of the two transistors to be on at any one time. By proper choice of bias, it is also arranged so that transistors 33 and 34 are biased by means of the loading system employed so that they will tend to remain on and to be turned off by pulses delivered through the steering transistors 7 or 8 in the gate.

Assuming transistor 35 to be in the "Off" condition, and transistor 33 as we have previously mentioned is biased to be On and therefore transistor 27 will be Off. At point 32, transistor 36 is On and since all emitter current provided at point 32 flows through transistor 36, transistors 34 and 28 are Off. With transistor 33 On, transistor 7, one of the steering transistors of the gate, is biased in the On condition, since the potential at the base of transistor 7 detected at the collector of transistor 33 is more positive than battery 3. This may be seen because the base of transistor 8 is connected directly to battery 3 which is a negative source whereas the potential of the base of transistor 7 is determined by the current flowing through transistor 33 through resistor 41 and coil 43, in series.

When an input pulse is applied to the base of transistor 2 turning it Off, as previously described in connection with Fig. 1, current flow to the emitter of transistor 2 through battery 11 and resistor 4 is directed through diode 5 to ground. Transistor 2 going Off, in effect, interrupts a drain on an available emitter current supplied to point 6 from battery 9 through resistor 10 so that emitter current is now available for either transistor 7 or transistor 8. In our illustrative assumption, namely, that transistor 35 is Off, the load path of 17, namely, the current path from battery 9 through resistor 19, resistor 20 and inductor 22 operates to maintain transistor 33 in the On condition. Therefore, the potential from the collector of transistor 33 is sensed at output 13 and applied to the base of transistor 7 is positive with respect to the bias applied to the base of transistor 8 from battery 3 and therefore transistor 7 will conduct. The conduction of transistor 7 causes the base of transistor 33 to go negative due to current flow into the inductor 22 connected to the base of transistor 33. This has no effect on the state of the bistable circuit, however, when the input goes negative, that is to say, at the end of the input pulse applied to terminal 1 of transistor 2 and transistor 2 again conducts, transistor 7 no longer conducts and the inductor 22 now places a positive pulse at the base of transistor 33 causing it to turn Off. Transistor 33 going Off leaves emitter current available at point 31 for transistor 27 which now turns On. Transistor 27 going On being cross-coupled through peaking coil 40 to the base of transistor 35 holds the base of transistor 35 positive and turns On transistor 35. Transistor 35 in going On removes the source of emitter current from battery 9 through resistor 37 available to supply transistor 36 thereby turning it Off. This transistor 36 going Off releases sufficient emitter current at point 32 to permit transistor 34 which is biased by virtue of the load applied to the base to turn On. Thus, the bistable circuit shown in Fig. 2 changed state so that in the second stable state, transistor 35 is conducting and transistor 34 is conducting.

A subsequent positive pulse now applied to transistor 2 operates in the following manner. Transistor 2 will be turned Off and transistor 7, since its base connected to output 13 is now more negative than ground and since transistor 33 is not conducting will not conduct, therefore transistor 8 will conduct applying a pulse to the inductor 26 until such time that the input pulse goes negative at which time transistor 34 will be turned Off. This operates the following chain of events. It releases emitter current at point 32 to turn On transistor 28. Transistor 28, coming On, shifts the potential level of the voltage divider through inductance 43 and resistor 41 to battery 3 such that the base of transistor 36 goes positive and turns transistor 36 On. Transistor 36 turning On removes emitter current from transistor 35 thereby turning it Off. Once transistor 35 has gone Off and since the bias on transistor 33 is at a sufficiently negative level, the current supplied to the point 31 now flows through transistor 33 turning it On. In this stable state, transistors 33 and 36 are conducting.

In order to further aid in understanding in practicing this invention, the following table of specifications for the circuit of Fig. 2 is provided. It being understood that the invention is not to be limited thereby since as is well known in the art, a wide range of such specifications are available for individual circuits and further that particular polarities selected for the transistors and power sources in the circuit may be interchanged by one skilled in the art.

Transistors 2, 27, 28, 33 and 34—PNP conductivity type. (High-speed transistors of the "Drift" or surface barrier type capable of dissipating 50 milliwatts in maximum machine ambient temperature range, frequency cut off—100 megacycles, emitter to base breakdown voltage—1 volt.)

Transistors 7, 8, 35 and 36—NPN conductivity type. (High-speed transistors of the "Drift" or surface barrier type capable of dissipating 50 milliwatts in maximum machine ambient temperature range, frequency cut off—100 megacycles, emitter to base breakdown voltage—1 volt.)

| | |
|---|---|
| Diodes **44, 45, 46, 47** and **5** | Transitron T14G or equivalent. |
| Battery **3** | −6 volts. |
| Battery **11** | +18 volts. |
| Battery **9** | −24 volts. |
| Resistors **20** and **24** | 220 ohms each. |
| Resistors **39** and **42** | 7,500 ohms each. |
| Resistors **19** and **23** | 9,100 ohms each. |
| Resistor **37** | 2,400 ohms. |
| Resistors **10** and **4** | 3,000 ohms each. |
| Resistors **38** and **41** | 220 ohms each. |
| Resistors **29** and **30** | 3,000 ohms each. |
| Inductors **40** and **43** | 2.7 microhenries each. |
| Inductors **22** and **26** | 15 microhenries each. |
| Capacitors **21** and **25** | .010 microfarad each. |
| Input pulse magnitude | −0.6 volts to +0.6 volts nominal (duration not critical). |
| Output pulse excursion | −6.6 volts to −5.4 volts nominal. |

The above described circuit has been found to switch at a pulse repetition rate of 10 megacycles.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A transistor gate circuit for Eccles-Jordan type bistable circuits comprising, in combination, first and second steering transistors having a particular conductivity type, means supplying the emitter of said first steering transistor and the emitter of said second steering transistor with a common source of constant current, a first load, means connecting the collector of said first steering transistor with said first load, a second load, means connecting the collector of said second steering transistor with said second load and means connecting said first and said second loads to reference potential, coupling means introducing changes in current in the collector of said first and said second steering transistors with a first and a second input of an Eccles-Jordan bistable circuit, sensing means for applying potential excursions at one output of said Eccles-Jordan bistable circuit to the base of said first steering transistor, potential means connected to the base of said second steering transistor having a magnitude that is less than the magnitude of the signal level sensed at said one output of said Eccles-Jordan bistable circuit when said circuit is in a first stable state and is greater than the signal level appearing at said output when said Eccles-Jordan type bistable circuit is in a second state, an input transistor having a conductivity type opposite to that of said steering transistors, means connecting the collector of said input transistor to the emitters of said steering transistors, a first asymmetric impedance, means connecting said first asymmetric impedance in the easy current flow direction between the emitter of said input transistor and reference potential, a source of constant current applied to the emitter of said input transistor and signal input introduction means connected to the base of said input transistor.

2. The steering circuit of claim 1 wherein said steering transistors are of the NPN type and said input transistor is of the PNP type.

3. The steering circuit of claim 1 wherein said steering transistors are of the PNP type and said input transistor is of the NPN type.

4. A binary type pulse handling device comprising an Eccles-Jordan bistable circuit having first and second inputs and first and second outputs, a first steering transistor having its collector return to reference potential through a load that is compatible with said first input of said Eccles-Jordan bistable circuit, means for sensing signal levels at said first output of said Eccles-Jordan type bistable circuit, coupling means coupling said potential excursion at said first output of said Eccles-Jordan type bistable circuit to the base of said first steering transistor, a second steering transistor having its collector return to reference potential through a load that is compatible with said second input of said Eccles-Jordan type bistable circuit, means coupling collector current excursions in said first and said second steering transistors to said first and said second inputs respectively of said Eccles-Jordan type bistable circuit, potential means coupled to the base of said second steering transistor having a magnitude that is greater than said first output of said Eccles-Jordan type bistable circuit and is less than the signal level at said output of said Eccles-Jordan type bistable circuit, a source of constant current, means connecting said constant current source to the emitter of said first and said second steering transistors, an input transistor, means connecting the collector of said input transistor to said emitters of said first and said second steering transistors, a second source of constant current, means connecting said second source of constant current to the emitter of said input transistor, a first asymmetric impedance having its cathode connected to ground and having its anode connected to the emitter of said input transistor, input signal and input signal introduction means coupled to the base of said input transistor.

5. The pulse handling circuit of claim 4 wherein said first and said second steering transistors are of the NPN type and said input transistor is of the PNP type.

6. The pulse handling circuit of claim 4 wherein said first and said second steering transistors are of the PNP type and said input transistor is of the NPN type.

7. A binary type steering circuit comprising a first, a second and a third active element each having at least an input, an output and a control electrode, a load connected to the output of said first element, a second load connected to the output of said second element, means connecting the input electrodes of said first and said second active elements together, a constant current source of supply delivering constant current to said input electrodes of said first and said second active elements, coupling means connected to the control electrode of said first active element capable of sensing the output signal level of an Eccles-Jordan type bistable circuit, biasing means coupled to a control electrode of said second active element, said biasing means being of a magnitude that is greater than the no signal level at said first output of said Eccles-Jordan type bistable circuit and is less than the signal level at said first output of said Eccles-Jordan type bistable circuit, means connecting the output electrode of said third active element to the input electrodes of said first and second active elements, means supplying constant current to the input of said third active element, an asymmetric impedance having its cathode connected to the input of said third active element and its anode connected to the reference potential, signal input means coupled to the control electrode of said third active element.

8. A binary type steering circuit comprising a first, a second and a third transistor, said first and said second transistors being of one conductivity type and said third transistor is of the opposite conductivity type, a load connected to the output of said first transistor, a second load connected to the output of said second transistor, means connecting the input electrodes of said first and said second transistors, together, a constant current source of supply delivering constant current to said input electrodes of said first and said second transistors, coupling means connected to the control electrode of said first transistor capable of sensing a signal level, biasing means coupled to a control electrode of said second transistor, said biasing means being of a magnitude that is greater than the low signal level of said sensed signal level and is less than the high signal level of said sensed signal level, means connecting the output electrode of said third transistor to the input electrodes of said first and second transistors, means supplying constant current to the input of said third transistor, an asymmetric impedance connected in the easy current flow direction between the input of said third transistor and reference potential, signal input means coupled to the control electrode of said third transistor.

9. The steering circuit of claim 8 wherein said first and said second transistors are NPN transistors and said third transistor is a PNP type transistor.

10. The steering circuit of claim 8 wherein said first and said second transistors are PNP type transistors and said third transistor is an NPN type transistor.

11. A binary type bistable circuit comprising, in combination, a first transistor, a second transistor, means supplying a source of constant current to a first common point connected to the emitter of said first transistor, means supplying constant current to a second common point connected to the emitter of said second transistor, a third transistor having a conductivity type opposite to that of said first transistor and having its collector connected to said first common point, a fourth transistor having a conductivity type opposite to said second transistor and having its collector connected to said second common point, a common source of emitter current for said third and said fourth transistors, a fifth transistor deriving its emitter current from said first common point, a sixth transistor deriving its emitter current from said second common point, a first source of potential having one terminal thereof connected to reference potential, a first impedance having one terminal thereof connected to said first source of potential and having the second terminal thereof connected to the base of said third transistor, a first inductance having one terminal thereof connected to the base of said third transistor and having the remaining terminal thereof connected to the collector of said sixth transistor, means connecting the collector of said first transistor to the collector of said sixth transistor, a second impedance having one terminal connected to said first potential source and having the remaining terminal thereof connected to the base of said fourth transistor, a second inductance having one terminal thereof connected to the base of said fourth transistor and the remaining terminal thereof connected to the collector of said fifth transistor, means connecting the collector of said second transistor to the collector of said fifth transistor, means connecting the bases of said first and said second transistors to reference potential, a second source of potential having a magnitude less than said first source of potential, a third resistor having one terminal thereof connected to the remaining terminal of said second source of potential and having the remaining terminal of said third resistor connected to the base of said third transistor, a fourth resistor having one terminal thereof connected to the remaining terminal of said second potential source and having the remaining terminal connected to said base of said fourth transistor, a first steering transistor, means coupling current flow in the collector of said first steering transistor to the base of said fifth transistor, a second steering transistor, means coupling current flow in the collector of said second steering transistor to the base of said sixth transistor, means for supplying a single source of constant current to both the emitters of said first and said second steering transistors, an input transistor, means coupling the collector of said input transistor to the emitters of said first and said second steering transistors, means supplying constant current to the emitter of said input transistor, a first asymmetric impedance connected in the easy current flow direction between the emitter of said input transistor and reference potential, means for introducing input signals to the base of said input transistor, sensing means coupled to the collectors of said fifth and said sixth transistors to sense changes in current flow therein, means coupling the base of said first steering transistor to the collector of said fifth transistor and means coupling the base of said second steering transistor to a source of potential having a magnitude that is greater than the potential level appearing at the collector of said fifth transistor when said fifth transistor is not conducting and less than the potential appearing at the collector of said fifth transistor when said fifth transistor is conducting.

12. A bistable circuit of claim 11 wherein said first transistor, said second transistor, said fifth transistor, said sixth transistor and said input transistor are of the PNP type and said third transistor, said fourth transistor, said first steering transistor and said second steering transistor are of the NPN type.

13. The bistable circuit of claim 11 wherein said first transistor, said second transistor, said fifth transistor, said sixth transistor and said input transistor are of the NPN type and said third transistor and said fourth transistor, said first steering transistor and said second steering transistor are of the PNP type.

14. A transistor bistable circuit comprising a first source of potential having a negative terminal thereof connected to reference potential, a first impedance having one terminal thereof connected to the positive terminal of said first source of potential, a first transistor having the emitter thereof connected to the remaining terminal of said first resistor, a second transistor having the emitter thereof connected to the emitter of said first transistor, a second resistor having one terminal thereof connected to the positive terminal of said first source of potential, a third transistor having the emitter thereof connected to the remaining terminal of said second impedance, a fourth transistor having the emitter thereof connected to the emitter of said third transistor, a first asymmetric impedance having the anode thereof connected to the emitter of said first transistor, a fifth transistor of opposite conductivity type to said first transistor having the collector thereof connected to the cathode of said first asymmetric impedance, a second asymmetric impedance having an anode thereof connected to the emitter of said third transistor, a sixth transistor of opposite conductivity type to said first transistor having the collector thereof connected to the cathode of said second asymmetric impedance, means connecting the base of said first transistor and said third transistor to reference potential, a third asymmetric impedance having the anode connected to reference potential and the cathode connected to the collector of said fifth transistor, a fourth asymmetric impedance having the anode thereof connected to reference potential and having the cathode thereof connected to the collector of said sixth transistor, a second source of potential having its positive terminal connected to reference potential, a third resistor having one terminal thereof connected to the negative terminal of said second source of potential and having the remaining terminal thereof connected to the base of said fifth transistor, a fourth resistor having one terminal thereof connected to the negative terminal of said second source of potential and having the remaining terminal thereof connected to the base of said sixth transistor, a first inductance having its first terminal connected to the base of said fifth transistor and having its second terminal connected to the collector of said first transistor and to the collector of said fourth transistor, a second inductance having a first terminal thereof connected to the base of said sixth transistor, and having the second terminal thereof connected to the collector of said third transistor and to the collector of said second transistor, a third source of potential having a magnitude greater than said second source of potential and having its positive terminal connected to reference potential, a fifth resistor having one terminal thereof connected to the negative terminal of said third source of potential and having the remaining terminal thereof connected to the base of said fifth transistor, a sixth resistor having one terminal thereof connected to the negative terminal of said third source of potential and having the remaining terminal thereof connected to the base of said sixth transistor, a seventh resistor having one terminal thereof connected to the negative terminal of said third source of potential and having the remaining terminal thereof connected to the base of said second transistor, an eighth resistor having one terminal thereof connected to the negative terminal of said third source of potential and having the remaining terminal thereof connected to the base of said fourth transistor, a first steering transistor of a conductivity type opposite to said first transistor, means connecting the base of said first steering transistor to the collector of said second transistor, a ninth resistor having one terminal thereof connected to the base of said second transistor and having the remaining terminal thereof connected to the collector of said first steering transistor, a first capacitor having one terminal thereof connected to the base of said second transistor and having the remaining terminal thereof connected to the collector of said first steering transistor, a third inductance having one terminal thereof connected to reference potential and having the remaining terminal thereof connected to the collector of said first steering transistor, a second steering transistor of a conductivity type opposite to said first transistor, means connecting the base of said second steering transistor to the negative terminal of said second source of potential, a tenth resistor having one terminal thereof connected to the base of said fourth transistor and having the remaining terminal thereof connected to the collector of said second steering transistor, a second capacitor having one terminal thereof connected to the base of said fourth transistor and the remaining terminal thereof connected to the collector of said second steering transistor, a fourth inductance having one terminal thereof connected to the collector of said second steering transistor and the remaining terminal thereof connected to reference potential an eleventh resistor having one terminal thereof connected to the negative terminal of said third source of potential and having the remaining terminal thereof connected to the emitter of said first steering transistor and to the emitter of said second steering transistor, a first input transistor of the same conductivity type as said first transistor having the collector thereof connected to the emitter of said first steering transistor, a twelfth resistor having one terminal thereof connected to the positive terminal of said first source of potential and having the remaining terminal thereof connected to the emitter of said input transistor, a fifth asymmetric impedance having the anode thereof connected to the emitter of said input transistor and the cathode thereof connected to reference potential, signal input means coupled to the base of said input transistor and output signal sensing means coupled to the collector of said second transistor and to the collector of said fourth transistor.

No references cited.